(12) United States Patent
Weiss et al.

(10) Patent No.: US 6,249,465 B1
(45) Date of Patent: Jun. 19, 2001

(54) REDUNDANCY PROGRAMMING USING ADDRESSABLE SCAN PATHS TO REDUCE THE NUMBER OF REQUIRED FUSES

(75) Inventors: Donald R Weiss; Jay Fleischman; Jeffery C Brauch, all of Ft Collins, CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/506,620

(22) Filed: Feb. 18, 2000

(51) Int. Cl.[7] .............................. G11C 7/00; G11C 29/00
(52) U.S. Cl. ................ 365/200; 365/230.03; 365/189.02
(58) Field of Search ............................... 365/200, 230.03, 365/230.02, 189.02

(56) References Cited

U.S. PATENT DOCUMENTS 4,355,376 * 10/1982 Gould .................................... 365/200
5,901,095 * 5/1999 Crafts .................................... 365/200

* cited by examiner

Primary Examiner—Huan Hoang

(57) ABSTRACT

A system and method are disclosed which provide the capability of repairing an optimum number of defective memory segments, such as RAM segments, in order to minimize the amount of unused repairing circuitry, such as fuses used for repairing defects within the memory. A preferred embodiment of the present invention provides a RAM block implemented such that the number of fuses required for repairing defects therein is proportional to the optimum number of defective segments capable of being repaired. A preferred embodiment allows for repairing an optimum number of defective segments, while being capable of repairing any of the segments (up to the optimum number) by mapping repair data to an appropriate defective segment. A preferred embodiment provides a repairable RAM block comprising multiple segments of RAM memory cells that are each repairable, a state machine capable of generating repair data for repairing one or more defective segments, a scan address machine capable of generating data identifying one or more defective segments, and a mapping circuitry for mapping the generated repair data of the state machine to the one or more defective segments specified by the scan address machine. Accordingly, by providing the capability of mapping generated repair data to any one of the segments of RAM that is detected as being defective, a preferred embodiment enables repairing an optimum number of defective segments, without being required to provide sufficient circuitry for repairing every segment of RAM.

20 Claims, 5 Drawing Sheets

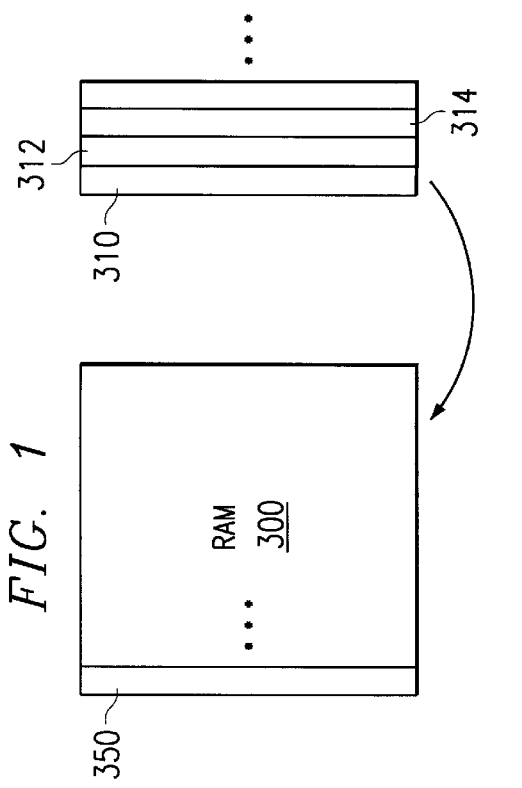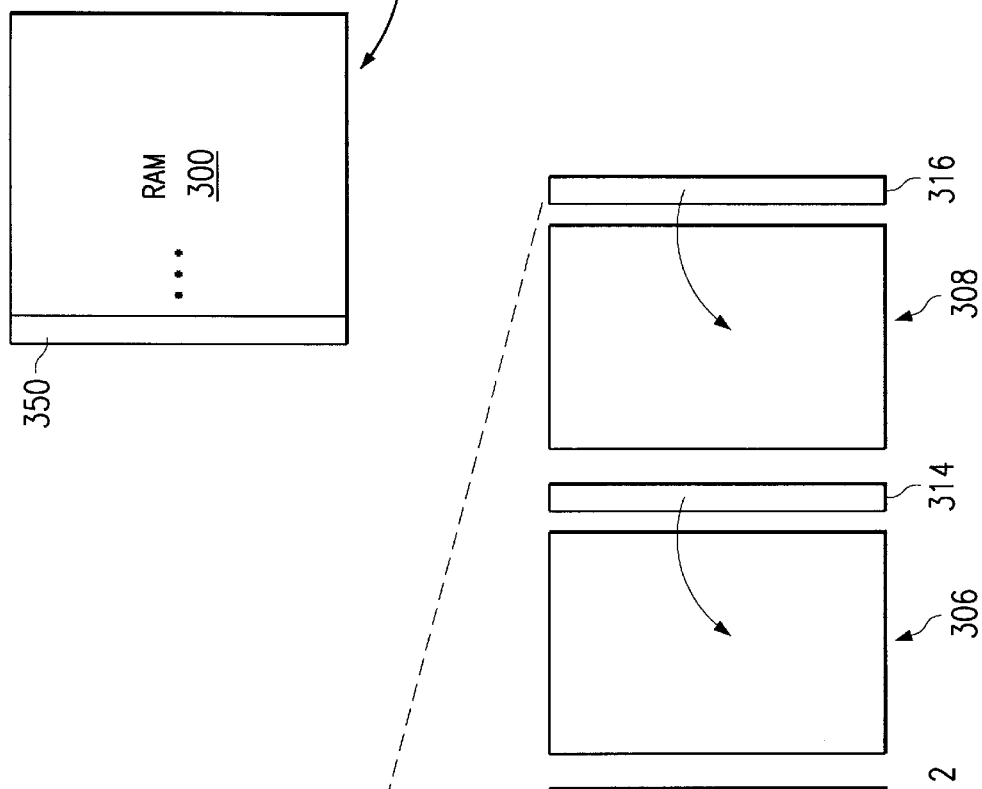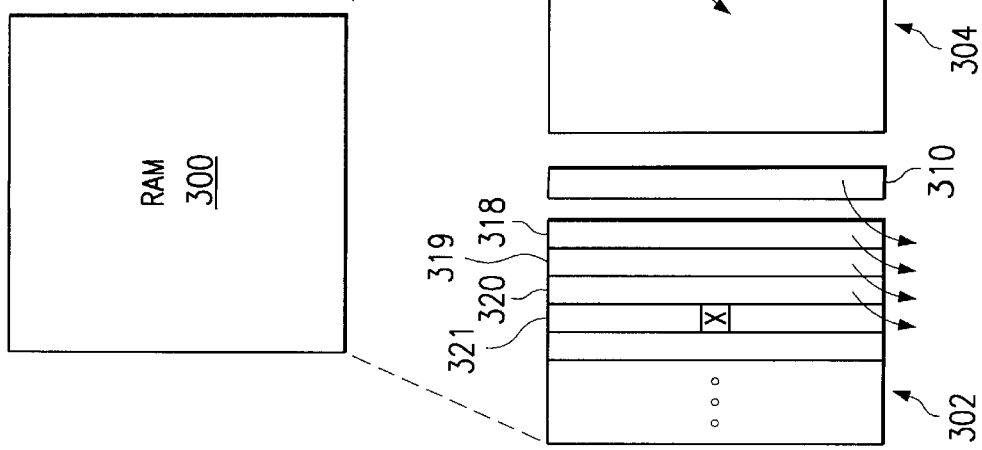
FIG. 1
FIG. 2 (PRIOR ART)

REDUNDANCY PROGRAMMING USING ADDRESSABLE SCAN PATHS TO REDUCE THE NUMBER OF REQUIRED FUSES

BACKGROUND

Random access memory ("RAM") is commonly implemented within computer systems of the prior art. Computer systems may employ a multi-level hierarchy of memory, with relatively fast, expensive but limited-capacity memory at the highest level of the hierarchy and proceeding to relatively slower, lower cost but higher-capacity memory at the lowest level of the hierarchy. The hierarchy may include a small fast memory called a cache, either physically integrated within a processor or mounted physically close to the processor for speed. The computer system may employ separate instruction caches ("I-caches") and data caches ("D-caches"). In addition, the computer system may use multiple levels of caches. The use of a cache is generally transparent to a computer program at the instruction level and can thus be added to a computer architecture without changing the instruction set or requiring modification to existing programs. Generally, RAM may be implemented within any such level of a multi-level hierarchy of memory utilized for a computer system.

Various RAM chips have been developed in the prior art to allow data to be moved in and out of memory quickly, to avoid errors, and to make collections of RAM chips smaller. The most common types of RAM include dynamic random access memory (DRAM), Extended Data Out random access memory (EDO RAM), video random access memory (VRAM), static random access memory (SRAM), synchronous DRAM (SDRAM), single in-line memory modules (SIMM), dual in-line memory modules (DIMM), and error-correcting code (ECC) chips. It is common in manufacturing (or "fabricating") a RAM chip that a defect may occur within a portion of the chip. That is, a portion of the RAM may not allow for the proper storage and/or retrieval of data. Accordingly, techniques have been developed in the prior art for detecting and correcting such defects. Generally, redundancy is desired in a chip or system with a large number of memory or circuit blocks where a defective block could be mapped to a non-defective block to improve the manufacturing yield and/or to keep a system operating properly. Typically, RAM memory is implemented in such a redundant system, and therefore the following description of the prior art focuses primarily on RAM memory implementations. However, it should be recognized that various other types of memory may be implemented with redundancy as well.

A common technique that is utilized in the prior art to correct defects detected in RAM chips is to provide redundant sub-blocks of memory within a RAM chip, which can be used to effectively replace a defective sub-block of memory within the chip. Turning to FIG. 1, an exemplary overview of implementing redundant sub-blocks within a RAM structure is shown. As shown, a very large RAM block (or RAM structure) 300 may be implemented within a chip. If a defect is present in the RAM block 300, it is desirable to be capable of repairing it to improve the yield of the die, and once it is determined that RAM 300 either has no defects or all of its defects have been repaired, to then ship the chip or system that includes RAM 300 to a customer. Repairing a defective RAM block 300 may be accomplished by providing a group of redundant sub-blocks, such as sub-blocks 310, 312, and 314, which may be used to replace a defective sub-block within RAM block 300. Accordingly, the term "repair" as used herein should not be read narrowly to mean physically repairing a defective sub-block, but should instead be read more broadly to encompass avoiding a defective sub-block. Ideally, it would be desirable to be capable of repairing any defective location in the RAM block 300 with any one of the redundant sub-blocks (e.g., any one of sub-blocks 310, 312, 314, etc.). However, a problem arises when shipping data (i.e., "memory data") from a defective sub-block within RAM block 300 to a redundant sub-block that is physically located at a relatively far distance away. That is, when a redundant sub-block is located relatively far away from a defective sub-block, the latency involved in transporting data such a long distance has a negative impact on the system's performance.

For example, suppose a defect occurs within sub-block 350 of RAM 300, which is physically located a relatively far distance away from the redundant sub-blocks (310, 312, 314, etc.). To repair sub-block 350, write data would have to be shipped from the port of sub-block 350 all the way over to a redundant sub-block, such as redundant sub-block 310, and read data would have to be shipped out from the redundant sub-block 310 to the port of sub-block 350 so it can be driven to its desired destination on the chip. The additional latency (i.e., wiring delay) resulting from shipping data such a long distance can have a large, negative impact on the performance of the system. That is, the additional latency resulting from shipping data a relatively long distance from a defective location to a redundant sub-block increases the amount of time required to access data within the redundant sub-block, thereby slowing the operating speed of the system.

Turning to FIG. 2, a design of the prior art that utilizes redundant sub-blocks to repair a RAM block 300 is illustrated. In the solution of FIG. 2, a large RAM block 300 is partitioned into smaller segments (or "banks"), such as segments 302, 304, 306 and 308. For each one of the segments 302, 304, 306, and 308, a redundant sub-block is assigned thereto. More specifically, redundant sub-block 310 is associated with segment 302, redundant sub-block 312 is associated with segment 304, redundant sub-block 314 is associated with segment 306, and redundant sub-block 316 is associated with segment 308. Accordingly, any defect in segment 302 can effectively be repaired with its redundant sub-block 310. Similarly, any defects within any of the other segments may be repaired using their respective associated redundant sub-blocks.

To further illustrate the operation of the prior art RAM design shown in FIG. 2, suppose that sub-block (or "sub-array") 321 within segment 302 is defective. Data is shifted from the nearest sub-block to the right of sub-block 321 to repair sub-block 321. That is, sub-block 320 is routed out to the input/output port (I/O port) of sub-block 321 through a MUX (not shown). Each of the remaining blocks to the right of sub-block 320 (i.e., sub-blocks 319 and 318 of FIG. 2) is shifted in a similar manner, and finally redundant sub-block 310 is shifted to provide the data for sub-block 318. Shifting of the nearest neighbor in this manner results in a relatively short routing length because data is only routed to a sub-block's nearest neighbor. Therefore, this prior art RAM design may be implemented to provide a high yield of a die by effectively allowing a defective RAM to be repaired.

It should be recognized that the exact manner in which the RAM block 300 is partitioned may vary. Typically, the number of segments in which a RAM block is partitioned is dependent on the number of functional units implemented for the RAM (e.g., the number of data cache units, tag cache units, etc.). More specifically, it is typically desirable to have the RAM segmented in a manner that allows for each functional unit to be repaired separately. For instance, the large RAM block 300 may be partitioned into six D-cache data segments, two I-cache data segments, two D-cache tag segments, and two I-cache tag segments. It should be recognized that any number of segments may be implemented in this manner. Typically, for a larger size RAM block 300, a greater number of segments are desirable in order to allow a high yield of the die. It should also be understood that each sub-block of a segment (e.g., sub-block 321, 320, 319, 318, 310, etc.) may actually comprise a group or "array" of memory cells. Thus, each sub-block may comprise X number of rows of memory cells by Y number of columns of memory cells. Accordingly, as used herein, the replaceable unit (or "repairable sub-block") may comprise an array of memory cells.

Turning to FIG. 3, a further example of the prior art implementation discussed with FIG. 2 is provided. FIG. 3 shows segment 302 of FIG. 2 in greater detail, but in the example shown in FIG. 3 sub-block 319 is defective, rather than sub-block 321. Thus, FIG. 3, shows repairable sub-blocks 330, 320, 319, and 318, as well as redundant sub-block 310 implemented for segment 302. A set of redundancy MUXes (e.g., MUXes 220, 222, 224, 226, 228, 230, 232, 234, and 236) are shown, which are utilized to reroute the actual data for a memory sub-block, which may be referred to herein as "memory data," if a defective subblock is detected within segment 302. In the example shown in FIG. 3, sub-block 330 is a good (non-defective) sub-block. Accordingly, the redundancy MUX 222 is programmed such that the memory data is flowing from the internal signal 18a of sub-block 330 through MUX 222 to "data out (DOUT)" signal 18b, which is the normal path for sub-block 330. Also, "data in (DIN)" signal 18c (which may also be considered "memory data") is received by MUX 220, which routes the DIN signal 18c to sub-block 330, thus routing the DIN signal 18c along the normal path for sub-block 330.

Similarly, sub-block 320 is a good (non-defective) sub-block. Accordingly, the redundancy MUX 226 is programmed such that the data is flowing from the internal signal 16a of sub-block 320 through MUX 226 to DOUT signal 16b, which is the normal path for sub-block 320. Also, DIN signal 16c is received by MUX 224, which routes the DIN signal 16c to sub-block 320, thus routing the DIN signal 16c along the normal path for sub-block 320. However, sub-block 319 is defective. Therefore, MUX 230 is programmed to output the DOUT signal from the nearest neighbor of sub-block 319, i.e., sub-block 318. That is, MUX 230 is programmed to route the internal DOUT signal 12a of sub-block 318 to DOUT signal 14b, rather than routing the internal DOUT signal 14a of defective sub-block 319 to DOUT signal 14b. Also, MUX 228 is turned off, and MUX 232 is programmed to route received DIN signals 14c to sub-block 318 instead of defective sub-block 319.

Because sub-block 318 has been effectively shifted to replace defective sub-block 319, redundant sub-block 310 is shifted to take the place of sub-block 318. To accomplish such a shift, MUX 234 is programmed to route the internal DOUT signal 10a of redundant sub-block 310 to DOUT signal 12b, rather than routing the internal data out signal 12a of sub-block 318 to DOUT signal 12b. Also, MUX 236 is programmed to route received DIN signals 12c to redundant sub-block 310 instead of sub-block 318. As a result, the data produced by the defective sub-block 319 is completely ignored. Additionally, data is only shifted by one sub-block in order to repair the defect, which produces very little latency in shipping the data. Moreover, 2:1 MUXes are implemented to allow for such a shift, which are fairly simple and have very little impact on performance (i.e., delays the signals very little).

Fuses are typically implemented in the RAM design to control the redundancy MUXes. Traditionally, laser-blown fuses have been utilized. Several problems exist with utilizing laser-blown fuses in the prior art implementation of FIG. 3. First, such laser-blown fuses are very small in size, but a large number of such fuses have traditionally been required. Additionally, laser-blown fuses must be blown at the wafer level of manufacturing a chip (i.e., before packaging). That is, laser-blown fuses can only be blown at the wafer level because once the circuitry is in its packaging, it is very difficult to get a laser to shine onto the die appropriately. Therefore, laser-blown fuses allow a manufacturer only one shot to detect and fix a defective RAM, i.e., during the wafer level. This is further problematic because the wafer level typically does not provide the most desirable electrical environment for detecting defects in the RAM. Therefore, it is possible that defects present in the RAM may not show up at the wafer stage, but show up later in the packaging stage. Electrically-blown fuses have been implemented within such a prior art RAM design. Electrically-blown fuses allow a manufacturer the flexibility of blowing the fuses at any point in time. Thus, a manufacturer may blow an electrically-blown fuse at a later stage than is possible with laser-blown fuses (e.g., after the packaging stage). However, electrically-blown fuses are much larger in size than laser-blown fuses because of the circuitry required to provide the larger currents needed to reliably blow each fuse.

One problem with the prior art implementation illustrated in FIG. 3 is that it requires one fuse to be implemented for each of the repairable sub-blocks. Accordingly, a large RAM typically requires a large number of fuses. However, only a small number of such fuses will typically be required to be blown. For example, in the case of defective sub-block 319 of FIG. 3, only fuse 20 is required to be blown, but the remaining fuses are required to be present in the RAM design in case a defect had been detected for one of the other sub-blocks. Requiring such a large number of fuses is particularly problematic when implementing the larger, electrically-blown fuses because of the relatively large amount of surface area required on the chip for such fuses.

Continuing with the discussion of the prior art design of FIG. 3, a scan path 22 is shown in the design. Scan path 22 typically comprises serial shift registers that allow data to be scanned in to program the redundancy MUXes from a controller that may be provided somewhere on the chip. Such scan path 22 may allow a manufacturer the ability to verify the appropriate control signals for the redundancy MUXes before actually blowing a fuse to set the control for the redundancy MUXes. That is, scan path 22 allows a manufacturer to scan in a set of control signals to ensure that such control signals do indeed repair the defective RAM correctly before blowing any fuses to actually set such control signals for the RAM. For example, in the case illustrated in FIG. 3 in which a defect exists in sub-block 319, the appropriate number of zeros followed by the appropriate number of ones may be scanned into the scan chain 22 to ensure that blowing fuse 20 would, in fact, repair such defect prior to actually blowing fuse 20.

In operation of such prior art RAM implementation, the fuse chain is pulled down to ground (GND) during reset. If none of the fuses are blown, then the entire fuse chain gets pulled down, and all zeros are programmed into the scan path latches. Accordingly, none of the redundancy MUXes are programmed to perform a shift. In the case where fuse 20 is blown, all of the traces of the fuse chain before the blown fuse 20 are pulled down, and all of the traces after the fuse chain 20 are pulled high. Therefore, the appropriate number of zeros and ones are loaded into the scan path latches causing the redundancy MUXes to perform the appropriate shift to repair the defective sub-block 319. Of course, if none of the sub-blocks are defective, then none of the fuses in fuse chain 20 are blown.

A further advancement made in the prior art is to implement a state machine to shift the data through the scan path. Turning to FIG. 4, this further advancement of the prior art is shown. In this prior art RAM design, a binary-coded number of fuses are utilized to program the position where the defect is located into the scan chain 22 using a state machine 210. As with the example shown in FIG. 3, in the example of FIG. 4 sub-block 319 is defective and the remaining sub-blocks are good (non-defective). Because sub-block 319 is defective, state machine 210 scans in a 1 (a high voltage value) to the corresponding scan latch for sub-block 319, as well as all of the scan latches for the following sub-blocks (i.e., sub-blocks 318 and 310). Accordingly, by blowing the appropriate fuses for state machine 210, the appropriate values can be provided to the scan chain latches 22 to control the redundancy MUXes in order to correct a defect within the RAM segment 302. Again, if none of the sub-blocks were defective, then none of the fuses are blown.

Because the fuses implemented in this design are arranged to binary code the desired values for the scan latches to control the redundancy MUXes, a fewer number of fuses are required than in the prior art design illustrated in FIG. 3. For example, if segment 302 contained 256 repairable sub-blocks, only nine fuses would be required to control the redundancy MUXes for segment 302. Accordingly, the number of fuses required to control the redundancy MUXes for a segment 302 can be calculated as log to the base 2 of 1 plus the number of sub-blocks within the segment. That is, in this prior art design, only "J" fuses are required to provide redundancy for $2^J-1$ sub-blocks of a segment of RAM, i.e., nine fuses for each segment having 256 sub-blocks ($2^9-1$ sub-blocks). A further advantage of this prior art design is that any sub-block within segment 302 may be repaired without requiring the state machine 210 and its fuses to be positioned physically close to the redundancy MUXes of segment 302. Typically, the scan paths 22 are shifted at relatively low frequencies at power up. A start pulse is typically triggered at reset, which is fed to state machine 210. A clock signal is also fed to the state machine 210, such that upon the start pulse being input to state machine 210 it reads its fuses and utilizes the clock signal to scan out the appropriate number of 1's and 0's to the scan chain 22. While state machine 210 produces some additional overhead within the circuitry, it is typically a relatively small component and can be placed anywhere on the chip. Accordingly, the state machine 210 is not required to be placed within the memory array itself, thereby not increasing the overhead for the memory array itself, which aids in maintaining the performance of the memory array high.

However, there are still some problems with the prior art implementation of FIG. 4. One problem is that only one defect can be repaired within a sub-block. As a result, a large RAM block may be partitioned into many smaller segments, such as segment 302. As a large number of segments are implemented for a RAM block, the number of fuses required for the RAM block implementation increases. For example, if the RAM is implemented with 16 segments having 256 sub-blocks each, then nine fuses are required for each segment, for a total of 144 fuses that must be implemented in the RAM design to control the redundancy MUXes. For instance, FIG. 5 illustrates an overview of such prior art design implemented for a RAM block 300 that is partitioned into sixteen segments (i.e., segments 500, 501, 502, . . . 515) having 256 sub-blocks each. As shown, sixteen state machines (i.e., state machines 210, 211, 212, . . . 215) are implemented having nine fuses each, for a total of 144 fuses. As shown in FIG. 5, state machine 210 controls the redundancy MUXes 400 for segment 500. State machine 211 controls the redundancy MUXes 401 for segment 501. State machine 212 controls the redundancy MUXes 402 for segment 502, and so on, through state machine 215, which controls redundancy MUXes 415 for segment 515. As also illustrated in FIG. 5, it should be understood that even though the prior art designs have been described thus far as providing redundant sub-block columns for a RAM segment, such prior art designs may instead be implemented to provide redundant sub-block rows for row redundancy utilizing redundancy MUXes 440, 441, 442, . . . 455.

Even though sixteen segments are implemented within the RAM design of FIG. 5, the probability of a defect occurring in all sixteen segments is very small. For example, on average, only 2, 3, 4, or 5 segments may have a defect. That is, when manufacturing a quantity of RAM chips, the average (or typical) number of defective segments within a chip may be very small. However, the probability of there being a defect in any one of the sixteen segments is equal. That is, the chances of a defect occurring in any given segment are equal. Accordingly, the RAM block must be designed in a manner such that any of the segments may be repaired, individually. Accordingly, an unnecessarily high number of fuses are required to be implemented in this prior art design because this design still requires that sufficient fuses be implemented to allow for all possible defects that may occur, rather than implementing only a sufficient number of fuses to correct the number of defects that are likely to occur within a RAM block. That is, a high number of fuses are required to be implemented within this prior art design, to give the possibility of repairing every segment, while many of the fuses are wasted because on average only a few of them are actually utilized to correct defects.

SUMMARY OF THE INVENTION

In view of the above, a desire exists for a memory structure, such as a RAM structure, that enables defective segments of such memory structure to be repaired. A further desire exists for a repairable memory structure that reduces the number of fuses required to be implemented for the repairable memory structure. Still a further desire exists for a repairable memory structure that implements sufficient circuitry for repairing only an optimum number of defective segments of the memory structure, rather than implementing sufficient circuitry for repairing every segment of the memory structure. Accordingly, a desire exists for a memory structure that implements only the number of fuses required for repairing an optimum number of defective segments of the memory structure, rather than implementing a sufficient number of fuses for repairing every segment of the memory structure. Yet a further desire exists for a repairable memory structure that allows for an optimum number of defective segments to be repaired, wherein any of the repairable segments of the memory structure may be designated as one of the optimum number of segments to be repaired. That is, a desire exists for a memory structure that is capable of repairing only an optimum number of segments but allows for any one of the repairable segments to be designated as one of such optimum number of segments to be repaired, thereby being capable of repairing any repairable segment up to an optimum number of segments.

These and other objects, features and technical advantages are achieved by a system and method which provide the capability of repairing an optimum number of defective memory segments, such as RAM memory segments, in order to minimize the amount of unused repairing circuitry. That is, a system and method are disclosed which provide the capability of repairing an optimum number of defective memory segments in order to minimize the number of unused fuses that are used for repairing defects within the memory. A preferred embodiment of the present invention provides a RAM block implemented in a manner such that the number of fuses required for repairing defects within the RAM block is proportional to the optimum number of defective segments capable of being repaired. An optimum number of defective segments to be capable of being repaired may be determined based on any criteria, such as cost, size requirements, and improvement in the yield of the chip's die. For example, a cost/benefit analysis may be performed to determine the optimum number of segments to be capable of repairing within a RAM block. For instance, the number of segments most commonly required to be repaired within a chip may be determined to be the optimum number (e.g., the average number of defective segments to be repaired for a RAM block). Accordingly, in a preferred embodiment, sufficient fuses are implemented for repairing only such optimum number of defective segments, rather than requiring sufficient fuses being implemented to allow for every segment of the RAM block to be repaired. Therefore, a preferred embodiment results in fewer unused fuses, and reduces the cost and area required to implement a repairable RAM block.

Moreover, a preferred embodiment allows for any defective RAM segment to be repaired, up to the optimum number of defective segments. Typically, the chances of any one RAM segment being defective are equal to the chances of any other RAM segment being defective within a RAM block. However, an optimum number of total defective segments exists. For example, suppose a RAM block is divided into sixteen segments. Further suppose that a high probability exists for four defective segments to be detected within the RAM block, but the probability is much lower for five defective segments being detected. Thus, it may be determined that the optimum number of defective segments to be capable of repairing within the RAM block is four. However, the chances of a defect occurring in any one segment of the RAM block are equal, so it is desirable to be capable of repairing any four of the sixteen RAM segments.

A preferred embodiment allows for repairing an optimum number of defective segments, while being capable of repairing any of the segments (up to the optimum number) by mapping repair data to an appropriate defective segment. More specifically, a preferred embodiment operates to detect a defect within a segment of a RAM block having multiple segments, generate repair data to repair such defect, generate data indicating the segment in which the defect was detected, and map the generated repair data to the segment in which the defect was detected in order to repair such defect. As discussed above, a preferred embodiment allows for an optimum number of defective segments to be repaired. Thus, a preferred embodiment may allow for multiple defective segments to be repaired within a RAM block. Accordingly, a preferred embodiment may be operable to detect a defect within multiple segments of a RAM block having multiple segments, generate repair data to repair each respective segment of said multiple segments in which defects were detected, generate data indicating each of the multiple segments in which defects were detected, and map the generated repair data for each respective segment in which defects were detected to each of such segments.

A preferred embodiment provides a repairable RAM block having multiple segments of RAM memory cells that are each repairable. For example, such segments may each include a redundant sub-block for repairing a defective sub-block within such segment. In a preferred embodiment, a repair data generator, such as a state machine, that is capable of generating repair data for repairing one or more defective segments is provided, and an address generator, such as a scan address machine, that is capable of generating data representing a defective one of the multiple segments (e.g., data identifying one or more defective segments of the RAM block) is provided. Additionally, a preferred embodiment comprises a mapping circuitry for mapping the generated repair data of the state machine to the one or more defective segments specified by the scan address machine. Accordingly, by providing the capability of mapping generated repair data to any one of the segments of RAM that is detected as being defective, a preferred embodiment enables repairing an optimum number of defective segments, without being required to provide sufficient circuitry for repairing every segment of RAM.

It should be appreciated that a technical advantage of one aspect of the present invention is that a repairable memory structure, such as a RAM structure, is implemented to allow for an optimum number of defective segments to be repaired, while allowing for such optimum number of defective segments to be selected from any of the memory block segments. Accordingly, a technical advantage of one aspect of the present invention is that it enables the amount of circuitry (e.g., fuses) implemented for providing a repairable memory block to be reduced to an optimum amount. Furthermore, the number of wasted, unused fuses implemented for repairing a memory block is minimized, thereby increasing the efficiency of fuses actually implemented in a repairable memory block, reducing the amount of surface area required for implementing a repairable memory block, and reducing the cost for implementing a repairable memory block.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWING

For a more complete understanding of the present invention, and the advantages thereof, reference is now made to the following descriptions taken in conjunction with the accompanying drawing, in which:

FIG. 1 shows an exemplary overview of implementing redundant sub-blocks within a RAM structure;

FIG. 2 shows a design of the prior art that utilizes redundant sub-blocks to repair a RAM block;

DETAILED DESCRIPTION

Figure 6:
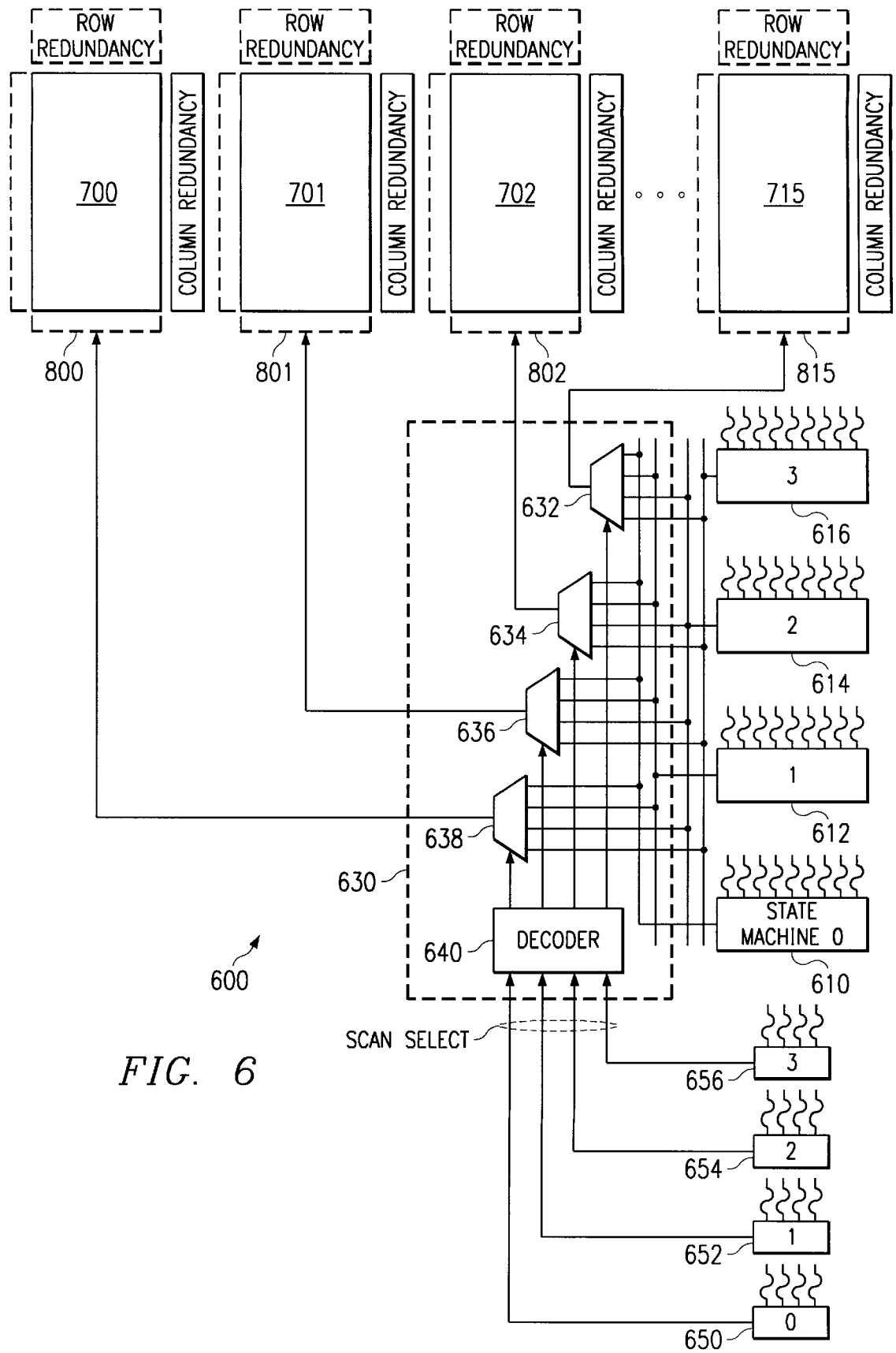
FIG. 6 shows an example of a preferred embodiment of the present invention.

Turning to FIG. 6, an example of a preferred embodiment of the present invention is shown. Shown in FIG. 6 is a RAM block 600 comprising multiple segments 700, 701, 702, . . . 715. In a most preferred embodiment, RAM block 600 is partitioned into sixteen segments having 256 sub-blocks each. However, in alternative embodiments, RAM block 600 may be implemented having any number of segments, each with any number of sub-blocks, and any such implementation is intended to be within the scope of the present invention. Each segment 700, 701, 702, . . . 715 is implemented with a corresponding set of redundancy MUXes 800, 801, 802, . . . 815, respectively. In a preferred embodiment, sufficient fuses are implemented to provide the capability of repairing a number of defects that are likely to occur within the RAM block 600, rather than providing sufficient fuses to allow the capability of repairing all possible defects that may occur within the RAM block 600. Thus, a preferred embodiment implements only a sufficient number of fuses that enable repairing of a number of defects that are likely to occur within RAM 600, while also enabling a defect occurring within any one of the segments of RAM 600 to be repaired.

Four fuse state machines 610, 612, 614, and 616 are implemented in the exemplary preferred embodiment of FIG. 6. Thus, in the exemplary embodiment illustrated in FIG. 6, four has been determined to be the optimum number of defects to be capable of repairing within RAM 600. For example, providing the capability of repairing four defects within RAM block 600 has been determined to provide the most cost effective increase in yield of the die. In other words, the added cost (in terms of money and/or surface area required on the chip) to provide the capability of repairing five defects has been determined to outweigh the amount of increase in yield that would result from such capability. It should be understood that any number of defects may be determined to be the optimum number of defects to be capable of repairing within RAM 600. RAM 600 may be implemented to provide the capability of repairing any such optimum (or desirable) number of defects, and any such implementation is intended to be within the scope of the present invention. Additionally, such an optimum number may be determined to be "optimum" (or desirable) for any reason, and any reason for which it is desirable to implement a RAM block 600 having capability of repairing any such optimum number of defects is intended to be within the scope of the present invention. Typically, such an optimum number is determined as being the number of defects commonly found in a RAM chip, which provides the most cost-effective increase in the yield of the die for such RAM chip.

In the example of FIG. 6, any one of the state machines 610, 612, 614, and 616 is capable of shifting out values to a scan path (scan latches) for controlling any one of the segments 700, 701, 702, . . . 715. Thus, any one of the state machines 610, 612, 614, and 616 may be utilized to control the redundancy MUXes for any one of the segments 700, 701, 702, . . . 715 in order to repair a defect within such segment. For example, state machine 610 is capable of shifting out the appropriate values (i.e., the appropriate number of 1's and 0's) to program any one of the scan paths/redundancy MUXes 800, 801, 802, . . . 815. Therefore, a preferred embodiment provides a number "N" of state machines, and the output of each state machine may be directed to any one segment that needs to be repaired, thereby allowing an optimum number "N" of defects that may occur within a RAM block to be repaired. Accordingly, in a preferred embodiment, the number of state machines (e.g., state machine 610) implemented is equal to the determined optimum number of defects to be capable of repairing in the RAM chip.

Accordingly, a preferred embodiment provides the capability of directing (or "mapping") the output of any one of the state machines to an appropriate segment that is in need of repair. Such mapping of the output of the state machines to an appropriate segment is accomplished in block 630, which may be referred to herein as "mapping" block 630. In a preferred embodiment, mapping block 630 comprises a decoder 640 (or set of decoders) and MUXes 632, 634, 636, and 638. It will be understood that any number of decoders and MUXes necessary to be implemented for repairing an optimum (or desirable) number of defects within a RAM block, which may comprise any number of segments, may be implemented, and any such implementation is intended to be within the scope of the present invention.

As shown, each of the MUXes 632, 634, 636, and 638 are associated with a segment 700, 701, 702, . . . 715. For example, as shown in FIG. 6, the output of MUX 632 is provided to the scan chain/redundancy MUXes 815 for segment 715. The output of MUX 634 is provided to the scan chain/redundancy MUXes 802 for segment 702. Likewise, the output of MUX 636 is provided to the scan chain/redundancy MUXes 801 for segment 701, and the output of MUX 638 is provided to the scan chain/redundancy MUXes 800 for segment 700. Furthermore, as shown in FIG. 6, the output of each of the state machines 610, 612, 614, and 616 is input to each of the mapping MUXes 632, 634, 636, and 638. Therefore, mapping MUX 638, for example, can be programmed to provide any one of the outputs of state machines 610, 612, 614, and 616 to control the scan chain/redundancy MUX 800. Likewise, the other mapping MUXes 632, 634, and 636 may be programmed to direct the output of any one of the state machines 610, 612, 614, and 616 to their respective segments, if necessary, to repair a defect present within such segment.

In a preferred embodiment, mapping block 630 further comprises a decoder 640 to control mapping MUXes 632, 634, 636, and 638. That is, decoder 640 outputs signals to control the operation of mapping MUXes 632, 634, 636, and 638. More specifically, decoder 640 outputs signals to specify which of the segments 700, 701, 702, . . . 715 each output from state machines 610, 612, 614, and 616 is to be mapped in order to repair a defect within such RAM segment. Thus, the signals output by decoder 640 specify to each mapping MUX which, if any, of the state machine outputs that each mapping MUX is to utilize to control the scan chain/redundancy MUXes of the segment corresponding to each mapping MUX.

As shown in FIG. 6, scan address machines 650, 652, 654, and 656 are implemented in a preferred embodiment to provide the appropriate signals to decode circuitry 640. In a most preferred embodiment, the RAM block 600 is partitioned into sixteen segments. Accordingly, scan address machines 650, 652, 654, and 656 are each implemented to be capable of specifying one of the sixteen segments that has a defect. Therefore, in a preferred embodiment, scan address machines 650, 652, 654, and 656 each comprise four fuses to allow each scan address machine to provide a binary code representing any one of the sixteen segments, which decode circuitry 640 is capable of decoding. Of course, RAM 600 may be implemented with any number "S" of segments. Accordingly, the number of fuses implemented for the scan address machines may be adjusted appropriately to allow for the scan address machines to provide a binary code representing the number "S" of segments implemented for the RAM 600, and any such implementation is intended to be within the scope of the present invention. Additionally, as discussed above, alternative embodiments may be implemented to provide the capability of repairing any optimum number "N" of defects that may occur within RAM 600 to be repaired. Accordingly, the present invention is not intended to be limited to implementing four scan address machines 650, 652, 654, and 656. Instead, alternative embodiments may be implemented to provide a number "N" of scan address machines to enable "N" defects that may occur within RAM block 600 to be repaired.

In a preferred embodiment, the state machines 610, 612, 614, and 616 operate upon a power up of the RAM 600 to read the defective sub-blocks of the segments within the RAM 600, and, if necessary, the state machines 610, 612, 614, and 616 each output an appropriate control sequence (sequence of 1's and 0's) to control the scan chain/redundancy MUXes of a defective segment to repair the defect within such segment. If a defective sub-block exists within four different segments, then each of the state machines 610, 612, 614, and 616 output an appropriate control sequence for repairing a separate defective sub-block, thereby collectively providing the necessary control sequences to correct all four defects. If a defective sub-block exists within only three different segments, then three of the state machines (e.g., 610, 612, and 614) output an appropriate control sequence for repairing a separate defective sub-block, thereby collectively providing the necessary control sequences to correct all three defects. The fourth state machine (e.g., 616) may simply be programmed to output all zeros, thereby resulting in no shift of the segment to which it is mapped (i.e., a non-defective segment). If more than four defects are detected within the RAM 600, the exemplary embodiment illustrated in FIG. 6 is incapable of repairing all of the defects. However, because four defects has been determined to be the optimum number of defects to repair for the exemplary embodiment of FIG.6, an unduly large number of chips having greater than four defects should not be encountered.

Also upon power up of the RAM, the scan address machines read their associated fuses to determine the segments of RAM 600 to be repaired, in a preferred embodiment. The scan address machines 650, 652, 654, and 656 may each output the proper binary code for a separate segment of RAM 600 to be repaired. Decoder 640 receives such binary codes and decodes them to control the mapping MUXes 632, 634, 636, and 638, such that the mapping MUXes are programmed to shift their respective data for repairing a sub-block out to the appropriate segments. In a preferred embodiment, each scan address machine 650, 652, 654, and 656 may be associated with a particular state machine 610, 612, 614, and 616, in order to specify the appropriate segment to map the "repair data" (e.g., the appropriate sequence of 1's and 0's) output by the particular state machine. For example, scan address machine 650 may specify the appropriate segment to which the repair data output by state machine 610 is to be mapped. Further, scan address machine 652 may specify the appropriate segment to which the repair data output by state machine 612 is to be mapped. Likewise, scan address machine 654 may specify the appropriate segment to which the repair data output by state machine 614 is to be mapped, and scan address machine 656 may specify the appropriate segment to which the repair data output by state machine 616 is to be mapped. In a preferred embodiment, where each segment has only one redundant sub-block associated therewith, the scan addresses output by scan address machines 650, 652, 654, and 656 are each a different address (i.e., specifying a different segment of RAM 600). However, if each segment has more than one redundant sub-block associated therewith for repairing more than one defective sub-block within a segment, then more than one of the scan addresses may output the same address (i.e., multiple scan addresses may specify the same segment to allow for multiple defective sub-blocks contained within the segment to be repaired).

Figure 3:
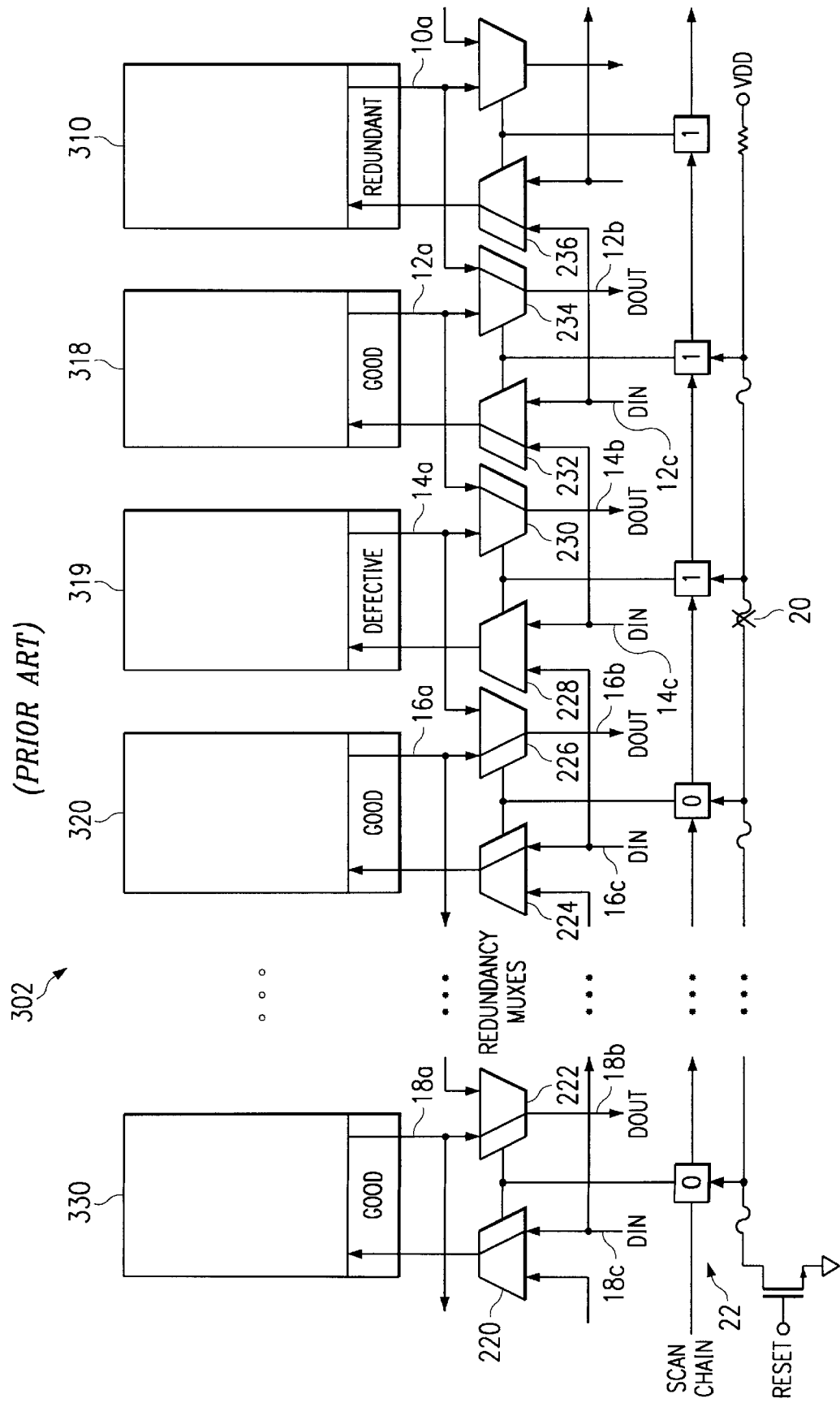
FIG. 3 shows the prior art implementation of FIG. 2 in greater detail.
Figure 4:
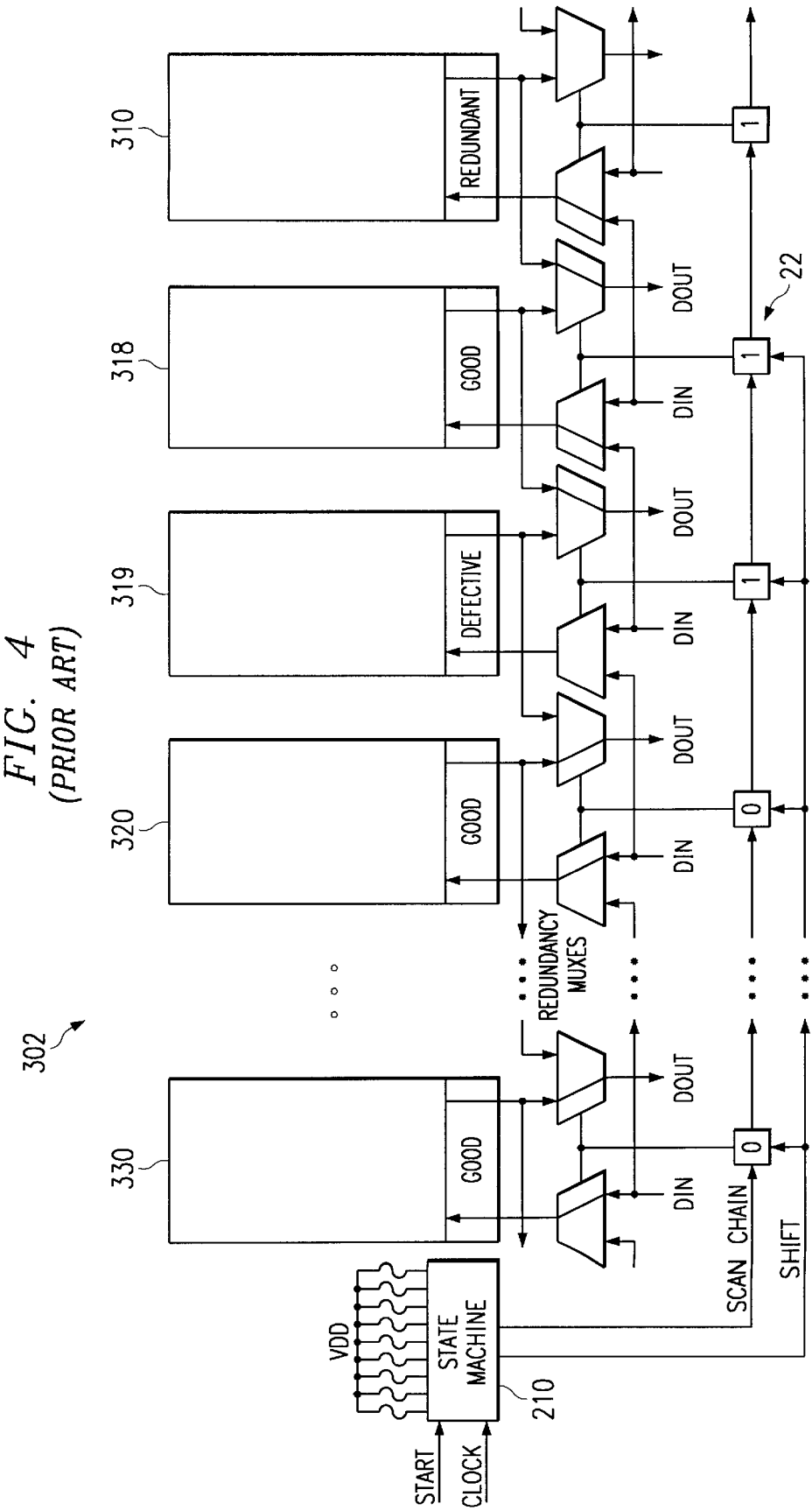
FIG. 4 shows a prior art redundancy implementation for a RAM block that implements a state machine to shift data through the scan path.

It should be recognized that one advantage of a preferred embodiment is that the number of segments implemented for the RAM 600 may be increased without requiring a large number of fuses to implement redundancy. It will be recalled that in prior art implementations the number of fuses incremented in a linear fashion as the number of segments increased. For example, in the prior art implementation discussed in conjunction with FIGS. 4 and 5, only nine fuses are required for the state machine 210 in order to provide redundancy for one segment of RAM 300 having 256 sub-blocks. However, 144 fuses are required for the state machines 210, 211, 212, . . . 215 in order to provide redundancy for sixteen segments 500, 501, 502, . . . 515 of RAM 300. Accordingly, "J" fuses are required for each segment to provide redundancy for $2^j-1$ sub-blocks of a segment of RAM (i.e., nine fuses for each segment having 256 sub-blocks), in this prior art design. As discussed above, the prior art requires such a high number of fuses because it must provide fuses to allow for the possibility of repairing a defect in each segment of RAM.

In contrast, a preferred embodiment potentially allows for a much smaller number of fuses to be implemented because it requires only the number of fuses necessary for repairing an optimum (e.g., a desirable, expected, or average) number of defects within the RAM block. For instance, if four defects is determined to be the optimum number of defects that occur within a RAM block 600 partitioned into sixteen segments 700, 701, 702, . . . 715 with each segment having 256 sub-blocks, only 52 total fuses are required to provide redundancy. That is, nine fuses are required for each of the four state machines implemented to allow for repairing four defects, and four fuses are required for each of the four scan address machines to allow each of the scan address machines to specify one of the sixteen segments, for a total of 52 fuses. As a further example, suppose that the RAM 600 were partitioned into 32 segments with each segment having 256 sub-blocks, and suppose that four defects is determined to be the optimum number of defects to be capable of repairing. Redundancy may be provided for such RAM 600 by implementing only 56 fuses. That is, nine fuses are required for each of the four state machines implemented to allow for repairing four defects, and five fuses are required for each of the four scan address machines to allow each of the scan address machines to specify one of the 32 segments, for a total of 56 fuses. Thus, the number of segments for RAM 600, in which four defects is determined to be the optimum number of repairable defects, may be increased from sixteen segments to 32 segments by adding only four fuses. In the prior art design of FIGS. 4 and 5, a 32 segment RAM in which each segment has 256 sub-blocks would require 288 fuses (i.e., nine fuses for each of the 32 segments).

Figure 5:
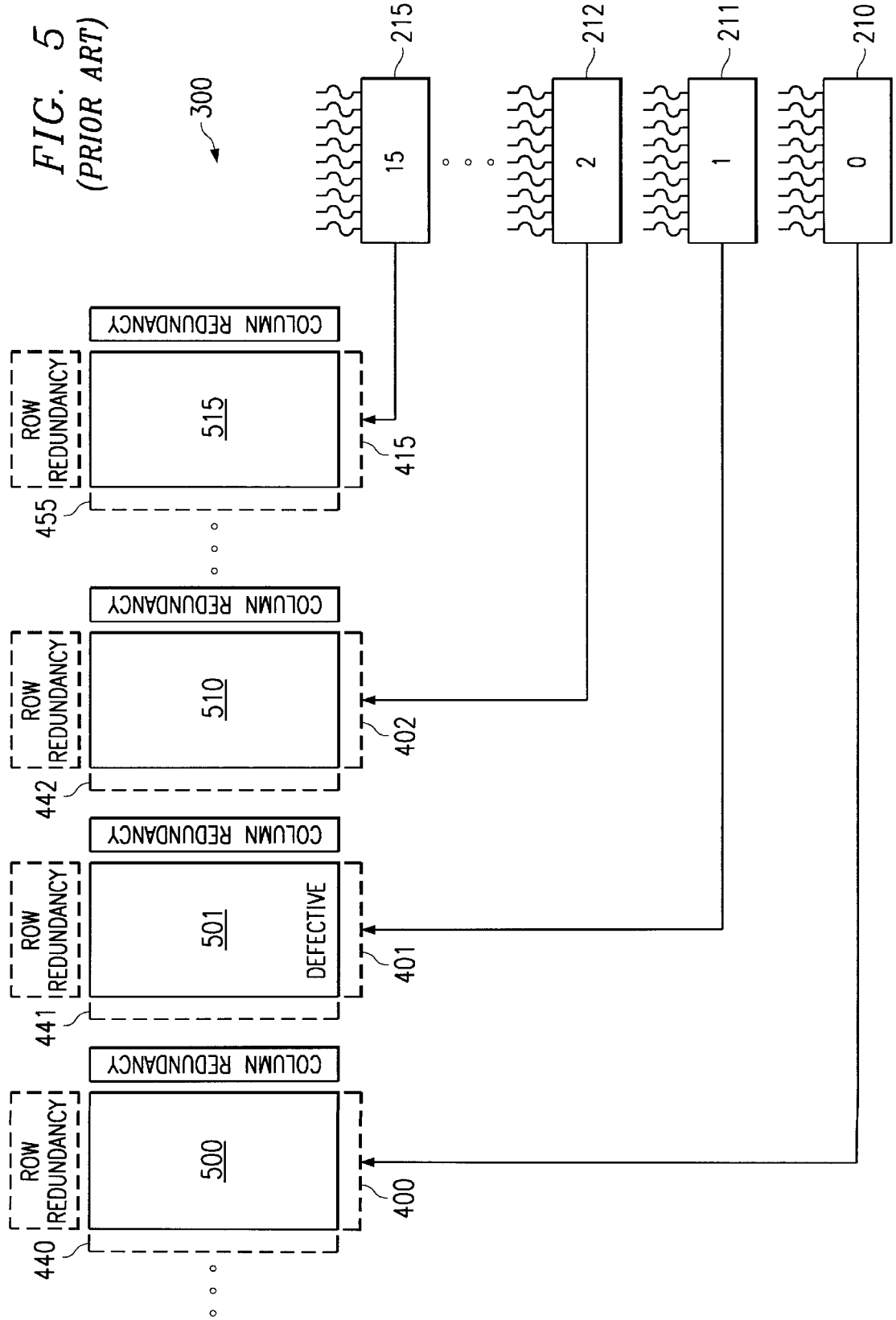
FIG. 5 shows an exemplary overview a prior art redundancy implementation for a RAM block that is partitioned into sixteen segments having 256 sub-blocks each.

It should be recognized that the repair data (e.g., sequence of 1's and 0's for controlling the redundancy MUXes of a segment) generated in prior art designs is not mapped to a defective segment, but is instead associated with a fixed, predetermined segment. For example, as shown in FIG. 5, the output of state machines 210, 211, 212, . . . 215 are each associated with a fixed, predetermined segment, i.e., segment 500, 501, 502, . . . 515, respectively. Thus, the output of such state machines of prior art designs are not mapped to defective segments, but instead each state machine has its output fixed to a specific segment. For instance, the output of state machine 210 may not be mapped to segment 501 because its output is fixed to segment 500. On the other hand, in a preferred embodiment, the state machines 610, 612, 614, and 616 of FIG. 6 are not each fixed to a predetermined segment, but instead, the repair data output by such state machines can be mapped to repair any defective segment 700, 701, 702, . . . 715.

In view of the above, a preferred embodiment provides a RAM design that allows for an optimum number of defects to be repaired, thereby reducing the number of fuses required for implementing redundancy. Such preferred embodiment provides the capability of repairing any segment of a RAM block, without requiring that a sufficient number of fuses necessary for repairing every segment of such RAM block be implemented. Additionally, while the state machines 610, 612, 614, and 616, the scan address machines 650, 652, 654, and 656, and the mapping block circuitry 630 produce some additional overhead for a preferred embodiment, such components are typically relatively small so as not to require an undue amount of surface space on the chip. Additionally, such state machines, scan address machines, and mapping block circuitry may be placed anywhere on the chip. Accordingly, such circuitry is not required to be placed within the memory array, thereby not increasing the overhead for the memory array itself, which aids in maintaining the performance of the memory array high.

A side benefit of providing all of the controllability of redundancy on-chip, as in a preferred embodiment, is that it is conducive to implementing a Built-In Self Test ("BIST") for the chip. Prior art RAM chips have been implemented with a BIST that generates test vectors for testing each one of the segments of the RAM block. The BIST typically reads and compares the data output by each sub-block of each segment to determine whether it passed or failed (i.e., to determine whether the appropriate data is output or whether the sub-block is defective). Based on the pass/fail results, a BIST may be implemented to then cause the appropriate repair data (i.e., the appropriate number of 1's and 0's) to a defective segment to determine whether the defect may indeed be repaired. Once the BIST determines that the defect could be repaired, it may then control latches that are required to be set to electrically blow the fuses of a state machine in order to program the state machine to output the proper repair data (i.e., the proper sequence of 1's and 0's necessary to repair a defect). Accordingly, with a small number of commands to the chip, a BIST can test the memory, determine a defective sub-block, determine whether such sub-block can be repaired, and then set up the appropriate number of fuses to repair the defect. The BIST may then be executed a final time to ensure that the fuses were programmed correctly and that the RAM is 100% good (non-defective).

Such a BIST may also be implemented in a preferred embodiment of the present invention. Such BIST of the prior art would need to be modified to control not only the state machine fuses, but also to control the scan address fuses. That is, the BIST would need to be implemented to control the state machine fuses in order to program a state machine to output the proper repair data, and the BIST would need to control the scan address machine fuses to cause the repair data of a state machine to be mapped to the appropriate segment of RAM. Of course, a preferred embodiment may be implemented without including a BIST therein, but most preferably some type of BIST is included for easy testing of the RAM chip and correcting any defects detected therein. Providing a BIST in the RAM chip implementation typically allows for much faster testing than manually testing the chip. It typically reduces overhead in programming fuses to control the redundancy, as well. Additionally, a BIST can typically be re-executed at power-up, if desired, to ensure that a defect has not occurred since the chip has been placed in service.

It should be understood that while a preferred embodiment has been disclosed herein for a repairable RAM structure, such a preferred embodiment is intended only as an example that renders the disclosure enabling for any other type of repairable memory structure. Therefore, the scope of the present invention is intended to encompass any type of repairable memory structure, and is not intended to be limited solely to a RAM memory structure. It should also be understood that the RAM design of a preferred embodiment may be implemented within any type of computer system, including but not limited to a personal computer (PC), a lap top computer, and a personal data assistant (e.g., a palm top PC).

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of repairing a memory block, said method comprising:

detecting a defect within a segment of a memory block having multiple segments;

generating repair data to repair said defect;

generating data indicating said segment in which said defect was detected; and mapping said repair data to said segment in which said defect was detected to repair said defect.

2. The method of claim 1 wherein said memory block is a RAM block.

3. The method of claim 1 wherein said repair data further includes:
data for controlling redundancy MUXes associated with said segment to reroute memory data from a defective sub-block of said segment to a non-defective sub-block of said segment.

4. The method of claim 1 further including the steps of:
determining an optimum number of defects capable of being repaired within said memory block; and
implementing sufficient circuitry for repairing only said optimum number of defects.

5. The method of claim 1 further including the steps of:
detecting a defect within multiple segments of said memory block having multiple segments;
generating repair data to repair each respective segment of said multiple segments in which said defects were detected;
generating data indicating each of said multiple segments in which said defects were detected; and
mapping said repair data for each respective segment in which said defects were detected to each of said segments in which said defects were detected.

6. The method of claim 1 further including the steps of
determining an optimum number "N" of defective segments capable of being repaired within said memory block; and
implementing sufficient circuitry for repairing only said optimum number "N" of defective segments.

7. The method of claim 6 further including the step of:
implementing said circuitry for repairing in a manner such that said circuitry is capable of repairing any "N" number of segments selected from said multiple segments of said memory block.

8. The method of claim 1 wherein said generating repair data step further includes the step of generating control signals for rerouting memory data from a defective sub-block of said segment to a first non-defective sub-block of said segment and for rerouting memory data from a second non-defective sub-block of said segment to a redundant sub-block of said segment.

9. The method of claim 8 wherein said first non-defective sub-block and said second non-defective sub-block are the same sub-blocks.

10. The method of claim 8 wherein said first non-defective sub-block and said second non-defective sub-block are different sub-blocks.

11. Memory structure comprising:
multiple segments of memory cells, wherein said multiple segments are each repairable;
means for repairing at least one of said multiple segments of memory cells;
means for generating repair data for repairing a defective one of said multiple repairable segments;
means for generating data identifying said defective one of said multiple repairable segments; and
means for mapping said repair data to said means for repairing said defective one of said multiple repairable segments.

12. The memory structure of claim 11 wherein said means for repairing includes at least one redundancy MUX controllable to reroute a memory access from a defective sub-block of memory cells to a non-defective sub-block of memory cells.

13. The memory structure of claim 11 wherein each of said multiple segments includes:
at least one repairable sub-block of memory cells; and
at least one redundant sub-block of memory cells.

14. The memory structure of claim 13 wherein said repair data comprises data for rerouting memory data from a defective one of said multiple sub-blocks of a segment to a non-defective one of said multiple sub-blocks of said segment.

15. A computer system comprising:
a processor for executing instructions;
a repairable memory structure accessible by said processor, said repairable memory structure comprising multiple segments of memory cells, wherein at least one of said multiple segments is repairable in that it has associated therewith repair circuitry controllable to reroute a memory access from a defective memory cell of the at least one repairable segment to a non-defective memory cell;
repair data generator for generating repair data for controlling the repair of one or more defective segments of said at least one repairable segment;
address generator for generating data identifying said one or more defective segments of said at least one repairable segment; and
mapping circuitry for mapping generated repair data to said repair circuitry associated with said identified one or more defective segments of said at least one repairable segment.

16. The computer system of claim 15 wherein said memory structure is a RAM structure, wherein said repair data generator is a state machine, and wherein said address generator is a scan address machine.

17. The computer system of claim 15 wherein each of said at least one repairable segment includes:
at least one repairable sub-block of memory cells; and
at least one redundant sub-block of memory cells.

18. The computer system of claim 15 wherein said mapping circuitry includes:
a decoder that decodes data received from said address generator; and
a MUX that maps said repair data to said repair circuitry associated with said identified one or more defective segments of said at least one repairable segment.

19. The computer system of claim 15, further comprising:
"N" number of repair data generators, each capable of generating repair data for repairing a defective segment of said at least one repairable segment;
"N" number of address generators, each capable of generating data identifying a defective segment of said at least one repairable segment; and
said mapping circuitry for mapping said repair data generated by each of said "N" repair data generators to said repair circuitry associated with said identified defective segments of said at least one repairable segment.

20. The computer system of claim 19, wherein said "N" number of repair data generators are each capable of generating repair data for repairing a different defective segment of said at least one repairable segment, and said "N" number of address generators are each capable of generating data identifying a different defective segment of said at least one repairable segment.

* * * * *